United States Patent
Hong et al.

(10) Patent No.: US 12,317,582 B2
(45) Date of Patent: May 27, 2025

(54) INTEGRATED CIRCUIT DEVICES INCLUDING A METAL RESISTOR AND METHODS OF FORMING THE SAME

(71) Applicant: Samsung Electronics Co., Ltd., Suwon-si (KR)

(72) Inventors: Byounghak Hong, Albany, NY (US); Hoonseok Seo, Albany, NY (US); Seungchan Yun, Waterford, NY (US); Inchan Hwang, Schenectady, NY (US); Kang-ill Seo, Albany, NY (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 554 days.

(21) Appl. No.: 17/547,700

(22) Filed: Dec. 10, 2021

(65) Prior Publication Data

US 2023/0095421 A1  Mar. 30, 2023

Related U.S. Application Data

(60) Provisional application No. 63/246,889, filed on Sep. 22, 2021.

(51) Int. Cl.
*H10D 84/80* (2025.01)
*H01L 23/48* (2006.01)
*H01L 23/522* (2006.01)
*H01L 23/528* (2006.01)
*H01L 23/535* (2006.01)
*H10D 1/47* (2025.01)
(Continued)

(52) U.S. Cl.
CPC ......... *H10D 84/811* (2025.01); *H01L 23/481* (2013.01); *H01L 23/5286* (2013.01); *H10D 1/47* (2025.01); *H10D 84/0149* (2025.01); *H10D 84/038* (2025.01)

(58) Field of Classification Search
CPC ......... H01L 27/0629; H01L 21/823475; H01L 23/481; H01L 23/5286; H01L 28/20; H01L 23/5228; H01L 23/535
See application file for complete search history.

(56) References Cited

U.S. PATENT DOCUMENTS 10,636,739 B2   4/2020   Beyne et al.
10,950,546 B1   3/2021   Doornbos
(Continued)

FOREIGN PATENT DOCUMENTS

WO   2021075353 A1   4/2021

*Primary Examiner* — Herve-Louis Y Assouman
(74) *Attorney, Agent, or Firm* — Myers Bigel, P.A.

(57) ABSTRACT

Integrated circuit devices including a metal resistor and methods of forming the same are provided. The integrated circuit devices may include a substrate including a first surface and a second surface that is opposite the first surface and is parallel to the first surface, a transistor including a gate electrode, first and second resistor contacts that are spaced apart from each other in a horizontal direction that is parallel to the second surface of the substrate, and a metal resistor. The first surface of the substrate may face the gate electrode. The metal resistor may include a third surface and a fourth surface that is parallel to the third surface and the second surface of the substrate, and the fourth surface of the metal resistor may be closer to the second surface than the first surface and contacts the first and second resistor contacts.

20 Claims, 26 Drawing Sheets

(51) Int. Cl.
*H10D 84/01* (2025.01)
*H10D 84/03* (2025.01)
*H10F 10/00* (2025.01)
*H10H 20/831* (2025.01)

(56) References Cited

U.S. PATENT DOCUMENTS

| | | | |
|---|---|---|---|
| 2004/0163234 A1* | 8/2004 | Provo | H01L 23/49827 |
| | | | 29/619 |
| 2006/0006981 A1* | 1/2006 | Seo | H01C 13/02 |
| | | | 257/E27.047 |
| 2012/0139049 A1* | 6/2012 | Kanike | H01L 28/20 |
| | | | 257/E27.035 |
| 2019/0080969 A1 | 3/2019 | Tsao | |
| 2020/0075489 A1 | 3/2020 | Liebmann et al. | |
| 2020/0105671 A1 | 4/2020 | Lai et al. | |
| 2020/0279811 A1 | 9/2020 | Hong et al. | |

\* cited by examiner

INTEGRATED CIRCUIT DEVICES INCLUDING A METAL RESISTOR AND METHODS OF FORMING THE SAME

CROSS-REFERENCE TO RELATED APPLICATION

This application claims priority to U.S. Provisional Application Ser. No. 63/246,889, entitled RESISTORS FORMED DURING PROCESSES OF FORMING BURIED POWER RAIL AND METHODS OF FORMING THE SAME, filed in the USPTO on Sep. 22, 2021, the disclosure of which is hereby incorporated by reference herein in its entirety.

FIELD

The present disclosure generally relates to the field of electronics and, more particularly, to integrated circuit devices including a metal resistor.

BACKGROUND

Various structures of an integrated circuit device and methods of forming the same have been proposed to increase the integration density thereof. Specifically, various structures of an integrated circuit device and methods of forming the same, which can simplify the middle-of-line (MOL) portion of device fabrication or the back-end-of-line (BEOL) portion of device fabrication, have been proposed.

SUMMARY

According to some embodiments of the present invention, integrated circuit devices may include a substrate including a first surface and a second surface that is opposite the first surface and is parallel to the first surface, a transistor on the substrate, first and second resistor contacts that are spaced apart from each other in a horizontal direction that is parallel to the second surface of the substrate, and a metal resistor. The transistor may include a gate electrode, and the first surface of the substrate may face the gate electrode. The metal resistor may include a third surface and a fourth surface that is parallel to the third surface and the second surface of the substrate, and the fourth surface of the metal resistor may be closer to the second surface than the first surface and contacts the first and second resistor contacts.

According to some embodiments of the present invention, integrated circuit devices may include a substrate, a metal resistor in the substrate, and first and second resistor contacts that are in the substrate and are spaced apart from each other. The metal resistor may contact the first and second resistor contacts.

According to some embodiments of the present invention, methods of forming an integrated circuit device may include performing a first process of forming a transistor on a first surface of a substrate, performing a second process of forming a metal resistor, and performing a third process of forming first and second resistor contacts on a second surface of the substrate. The second surface may be opposite the first surface and may be parallel to the first surface, and the metal resistor may be electrically connected to the first and second resistor contacts.

DETAILED DESCRIPTION

According to some embodiments of the present invention, resistor contacts that are electrically connected to a metal resistor may be formed by a process performed on a backside of a substrate, instead of by a process performed on a front side of the substrate during the MOL portion of device fabrication or the BEOL portion of device fabrication. Accordingly, the MOL portion of device fabrication or the BEOL portion of device fabrication may be simplified, and wires (e.g., metal lines) formed on the front side of the substrate may be simplified. In some embodiments, resistor contacts may be formed concurrently with a buried power rail (BPR) and thus those resistor contacts may be formed without an additional process.

Figure 1:
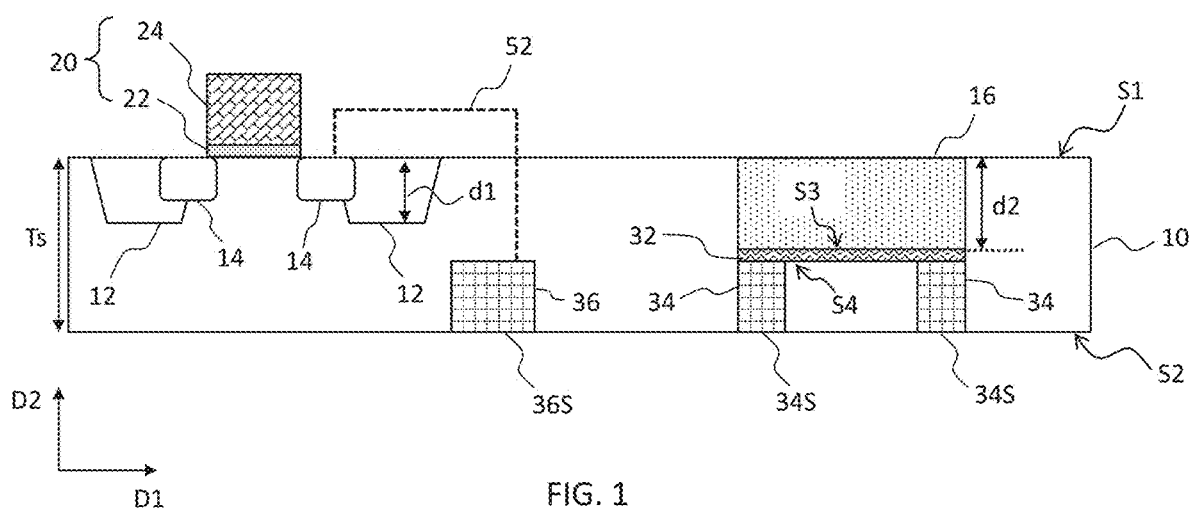
FIGS. 1, 2, 3, 4 and 5 are cross-sectional views of an integrated circuit device according to some embodiments of the present invention.

FIG. 1 is a cross-sectional view of an integrated circuit device 110 according to some embodiments of the present invention. Referring to FIG. 1, the integrated circuit device 110 may include a substrate 10 that may include a first surface S1 and a second surface S2. The first surface S1 and the second surface S2 may be opposite and parallel to each other. Each of the first surface S1 and the second surface S2 may extend in a first direction DI that may be a horizontal direction. The first surface S1 may be a front side of the substrate 10, and the second surface S2 may be a backside of the substrate 10. The first surface S1 of the substrate 10 may be referred to as an upper surface of the substrate 10, and the second surface S2 of the substrate 10 may be referred to as a lower surface of the substrate 10. The first surface S1 and the second surface S2 may be spaced apart from each other in a second direction D2. The second direction D2 may be perpendicular to the first surface S1 and the second surface S2 and may be a vertical direction.

The integrated circuit device 110 may include a transistor including a gate structure 20 and source/drain regions 14 that are in the substrate 10 adjacent respective side surfaces of the gate structure 20. The source/drain regions 14 may be between isolation regions 12 that are formed in the substrate 10. The isolation region 12 may be a shallow trench isolation (STI) and may include an insulating material(s). The source/drain regions 14 may be spaced apart from each other in the first direction D1, and a current may flow in the first direction D1. Although FIG. 1 illustrates a planar transistor, the present invention is not limited thereto. In some embodiments, the transistor may be various types of transistors (e.g., a fin field-effect transistor (FinFET), a gate-all-around field-effect transistor (GAA FET) or a recessed channel array transistor (RCAT)).

The gate structure 20 may include a gate insulator 22 and a gate electrode 24. The first surface S1 of the substrate 10 may face the gate electrode 24. Although FIG. 1 illustrates each of the gate insulator 22, the gate electrode 24, the isolation region 12 and the source/drain region 14 as a single layer, in some embodiments, each of the gate insulator 22, the gate electrode 24, the isolation region 12 and the source/drain region 14 may include multiple layers.

The integrated circuit device 110 may also include a power rail 36 that may be electrically connected to the source/drain region 14 through a first wiring structure 52. The power rail 36 may be electrically connected to a power source having a voltage (e.g., Vdd or Vss) and may supply power to the source/drain region 14. The first wiring structure 52 may include at least one conductive wire (e.g., a metal wire) and/or at least one conductive via (e.g., a metal via) and may further include insulating layer(s) that electrically isolate the conductive wire and the conductive via from adjacent conductive elements. The power rail 36 may include a power rail surface 36S exposed by the substrate 10. In some embodiments, the power rail surface 36S of the power rail 36 may be coplanar with the second surface S2 of the substrate 10 as illustrated in FIG. 1.

Additionally, the integrated circuit device 110 may include a metal resistor 32 and first and second resistor contacts 34 in the substrate 10. The metal resistor 32 may include a third surface S3 and a fourth surface S4 that may be opposite and parallel to the third surface S3. The third surface S3 and the fourth surface S4 of the metal resistor 32 may be parallel to the first surface S1 and the second surface S2 of the substrate 10, and the fourth surface S4 may be closer to the second surface S2 of the substrate 10 than the first surface S1 of the substrate 10. The third surface S3 of the metal resistor 32 may be referred to as an upper surface of the metal resistor 32, and the fourth surface S4 of the metal resistor 32 may be referred to as a lower surface of metal resistor 32. In some embodiments, the fourth surface S4 of the metal resistor 32 and the second surface S2 of the substrate 10 may face the same direction as illustrated in FIG. 1. The third surface S3 and the fourth surface S4 of the metal resistor 32 may be parallel to the first direction D1. The fourth surface S4 of the metal resistor 32 may contact the first and second resistor contacts 34. The first and second resistor contacts 34 may be spaced apart from each other in the first direction D1. Each of the first and second resistor contacts 34 may include a contact surface 34S that may be exposed by the substrate 10 as illustrated in FIG. 1. In some embodiments, the contact surface 34S may be coplanar with the second surface S2 of the substrate 10. A first insulating layer 16 may be provided in the substrate 10 and may contact the third surface S3 of the metal resistor 32.

In some embodiments, the metal resistor 32 may include a material the same as or different from the first and second resistor contacts 34. For example, each of the metal resistor 32 and the first and second resistor contacts 34 may include a metal layer (e.g., a ruthenium layer, a molybdenum layer, a copper layer, a cobalt layer, an aluminum layer and/or a tungsten layer) and/or a metal nitride layer (e.g., a titanium nitride layer and/or a tantalum nitride layer). In some embodiments, the metal resistor 32 may have a thickness in the second direction D2 in a range of from about 1 nanometer (nm) to about 15 nm. For example, the thickness of the metal resistor 32 in the second direction D2 may be in a range of from about 5 nm to about 10 nm. A first depth d1 of the isolation region 12 from the first surface S1 of the substrate 10 in the second direction D2 may be smaller than a second depth d2 of the metal resistor 32 from the first surface S1 of the substrate 10 in the second direction D2. For example, the second depth d2 of the metal resistor 32 may be in a range of from about 50 nm to about 100 nm.

The substrate 10 may include one or more semiconductor materials, for example, Si, Ge, SiGe, GaP, GaAs, SiC, SiGeC and/or InP. In some embodiments, the substrate 10 may be a bulk substrate (e.g., a bulk silicon substrate) or a semiconductor on insulator (SOI) substrate. In some embodiments, a thickness Ts of the substrate 10 in the second direction D2 may be less than 150 nm (e.g., less than 100 nm). For example, the thickness Ts of the substrate 10 in the second direction D2 may be in a range of from about 85 nm to about 100 nm. The gate insulator 22 may include an insulating layer such as a silicon oxide layer and/or a high-k material layer. The high-k material layer may include, for example, hafnium silicate, zirconium silicate, hafnium dioxide and/or zirconium dioxide. The gate electrode 24 may include a semiconductor layer (e.g., a poly silicon layer), a work function layer (e.g., TiC layer, TiAl layer, TiAlC layer or TiN layer) and/or a metal layer (e.g., a tungsten layer, an aluminum layer or a copper layer). The source/drain regions 14 may include a semiconductor material (e.g., Si or SiGe) and impurities (e.g., B, P or As).

Figure 2:
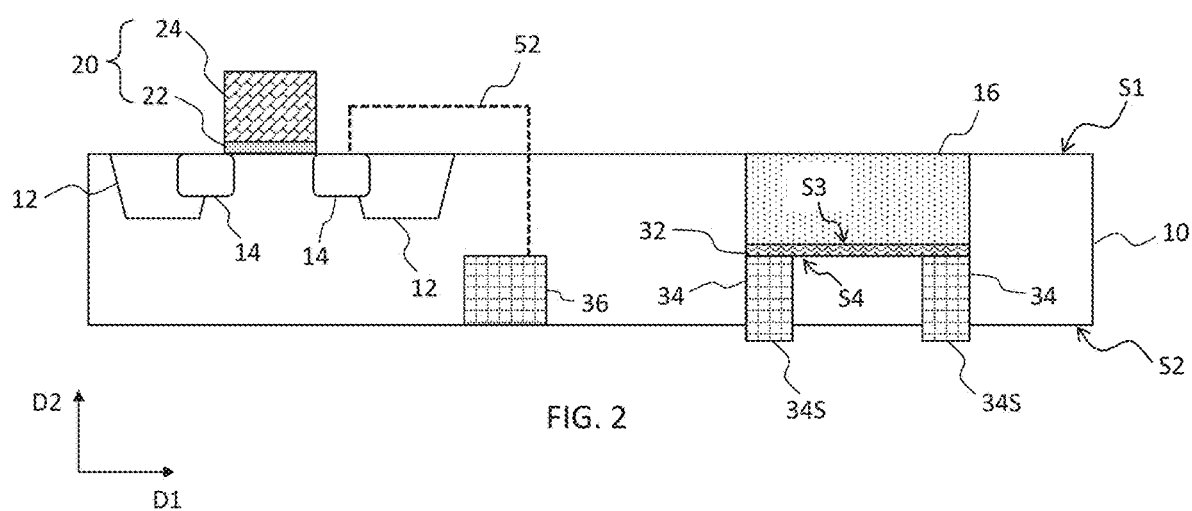

FIG. 2 is a cross-sectional view of an integrated circuit device 120 according to some embodiments of the present invention. The integrated circuit device 120 may be similar to the integrated circuit device 110 illustrated in FIG. 1 with a primary difference being that the contact surfaces 34S of the first and second resistor contacts 34 protrude outwardly beyond the second surface S2 of the substrate 10.

Figure 3:
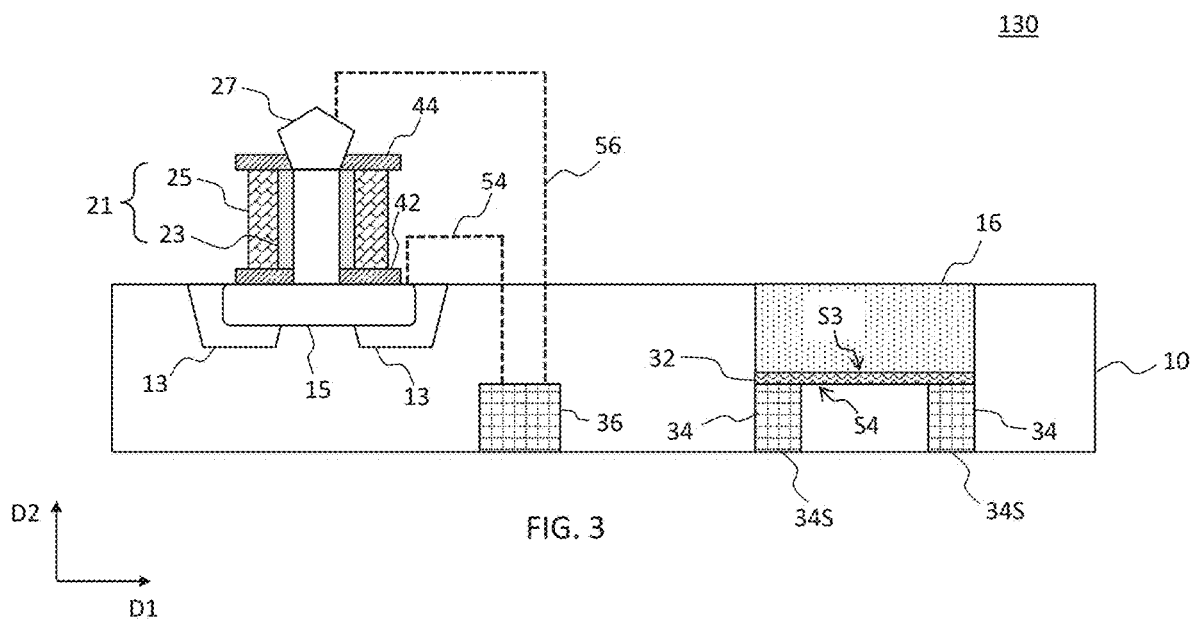

FIG. 3 is a cross-sectional view of an integrated circuit device 130 according to some embodiments of the present invention. The integrated circuit device 130 may be similar to the integrated circuit device 110 illustrated in FIG. 1 with a primary difference being that a transistor is a vertical transistor in which a current may flow in a vertical direction (i.e., the second direction D2). The transistor may include a bottom source/drain region 15 and a top source/drain region 27 that may be spaced apart from each other in the second direction D2.

A vertical gate structure 21 may be provided between the bottom source/drain region 15 and the top source/drain region 27. The vertical gate structure 21 may include a gate insulator 23 and a gate electrode 25. Further, a bottom spacer 42 and a top spacer 44 may be provided. The bottom spacer 42 may separate the gate electrode 25 from the bottom source/drain region 15 and may electrically isolate the gate electrode 25 from the bottom source/drain region 15. The top spacer 44 may separate the gate electrode 25 from the top source/drain region 27 and may electrically isolate the gate electrode 25 from the top source/drain region 27. The bottom spacer 42 and the top spacer 44 may include an insulating material (e.g., silicon oxide, silicon nitride, silicon oxynitride, silicon carbide or low-k material). The low k material may include, for example, fluorine-doped silicon dioxide, organosilicate glass, carbon-doped oxide, porous silicon dioxide, porous organosilicate glass, spin-on organic polymeric dielectrics, or spin-on silicon based polymeric dielectric.

The integrated circuit device 130 may also include a power rail 36 that may be electrically connected to one of the bottom source/drain region 15 and the top source/drain region 27. In some embodiments, the power rail 36 may be electrically connected to the bottom source/drain region 15 through a second wiring structure 54. In some embodiments, the power rail 36 may be electrically connected to the top source/drain region 27 through a third wiring structure 56. Each of the second and third wiring structures 54 and 56 may include at least one conductive wire (e.g., a metal wire) and/or at least one conductive via (e.g., a metal via) and may further include insulating layer(s) that electrically isolate the conductive wire and the conductive via from adjacent conductive elements. Although two types of transistors (i.e., a planar transistor and a vertical transistor) are illustrated in FIGS. 1 and 3, the present invention is not limited thereto. An integrated circuit device according to some embodiments of the present invention may include various types of transistors (e.g., stacked transistors).

Figure 4:
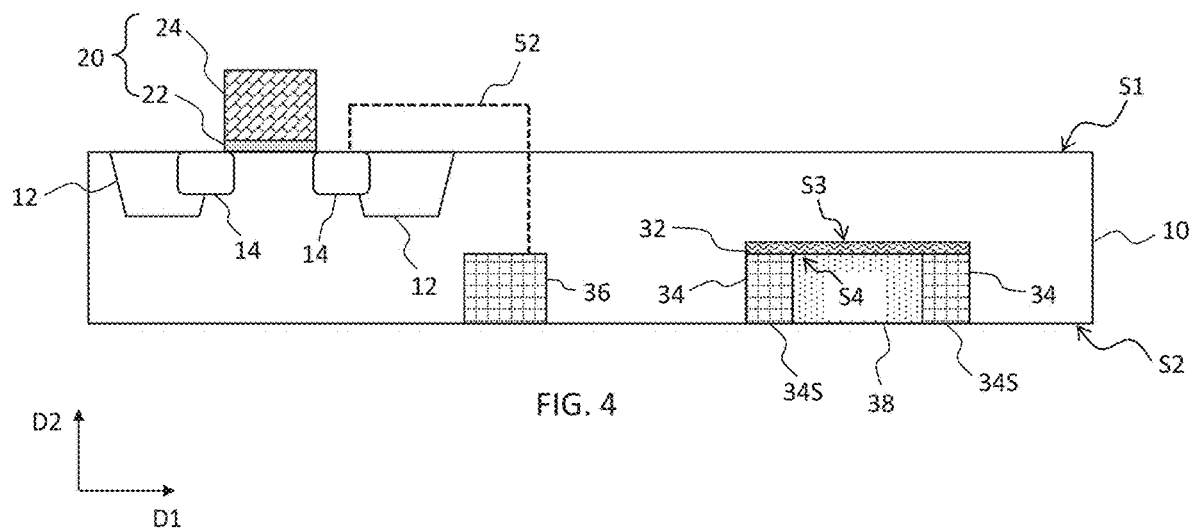

FIG. 4 is a cross-sectional view of an integrated circuit device 140 according to some embodiments of the present invention. The integrated circuit device 140 may be similar to the integrated circuit device 110 illustrated in FIG. 1 with a primary difference being that the first insulating layer 16 may be omitted, and a second insulating layer 38 may be provided in the substrate 10. In some embodiments, the second insulating layer 38 may contact the fourth surface S4 of the metal resistor 32 and may include a surface exposed by the substrate 10. In some embodiments, the second insulating layer 38 may contact side surfaces of the first and second resistor contacts 34.

Figure 5:
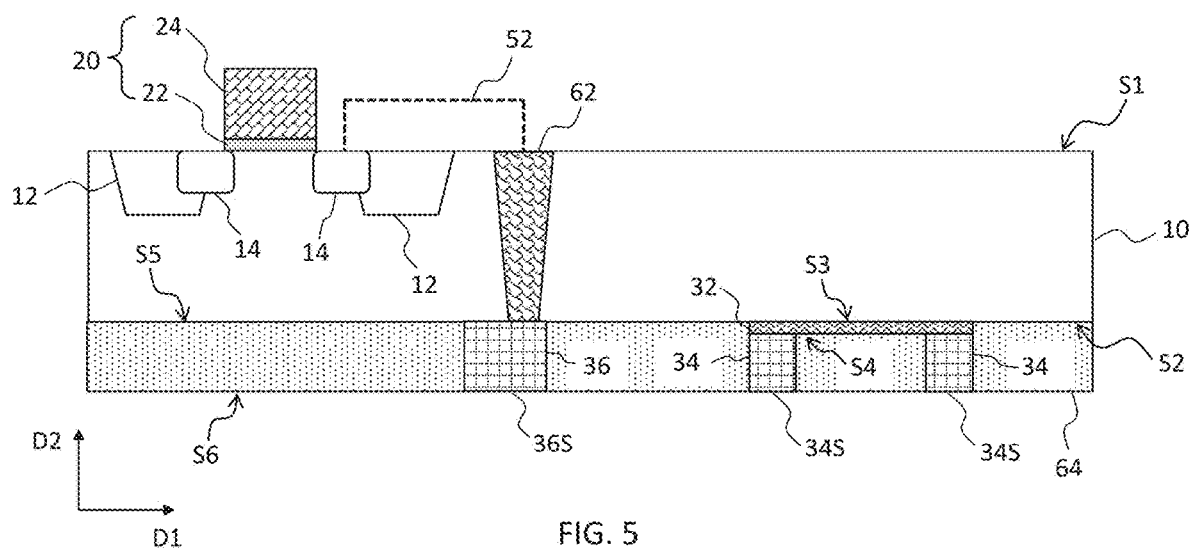

FIG. 5 is a cross-sectional view of an integrated circuit device 210 according to some embodiments of the present invention. The integrated circuit device 210 may be similar to the integrated circuit device 110 illustrated in FIG. 1 with a primary difference being that a conductive via 62 and a third insulating layer 64 are additionally provided.

Referring to FIG. 5, the third insulating layer 64 may be provided on and may contact the second surface S2 of the substrate 10. The third insulating layer 64 may include a fifth surface S5 and a sixth surface S6 that may be opposite and parallel to the fifth surface S5. The fifth surface S5 and the sixth surface S6 may be parallel to the first direction D1. The fifth surface S5 of the third insulating layer 64 may contact the second surface S2 of the substrate 10.

The metal resistor 32, the first and second resistor contacts 34, and the power rail 36 may be provided in the third insulating layer 64. The third surface S3 of the metal resistor 32 may contact the second surface S2 of the substrate 10. The third insulating layer 64 may expose the contact surfaces 34S of the first and second resistor contacts 34. In some embodiments, the contact surfaces 34S of the first and second resistor contacts 34 may be coplanar with the sixth surface S6 of the third insulating layer 64 as illustrated in FIG. 5 but the present invention is not limited thereto. In some embodiments, the contact surfaces 34S of the first and second resistor contacts 34 may protrude outwardly in the second direction D2 beyond the sixth surface S6 of the third insulating layer 64. In some embodiments, the power rail surface 36S of the power rail 36 may be coplanar with the sixth surface S6 of the third insulating layer 64.

A conductive via 62 may be provided in the substrate 10. The conductive via 62 may extend through the substrate 10 and may electrically connect the source/drain region 14 to the power rail 36.

Each of the first, second and third insulating layers 16, 38 and 64 may include an insulating material (e.g., silicon oxide, silicon oxynitride, silicon carbide or low-k material).

Figure 6:
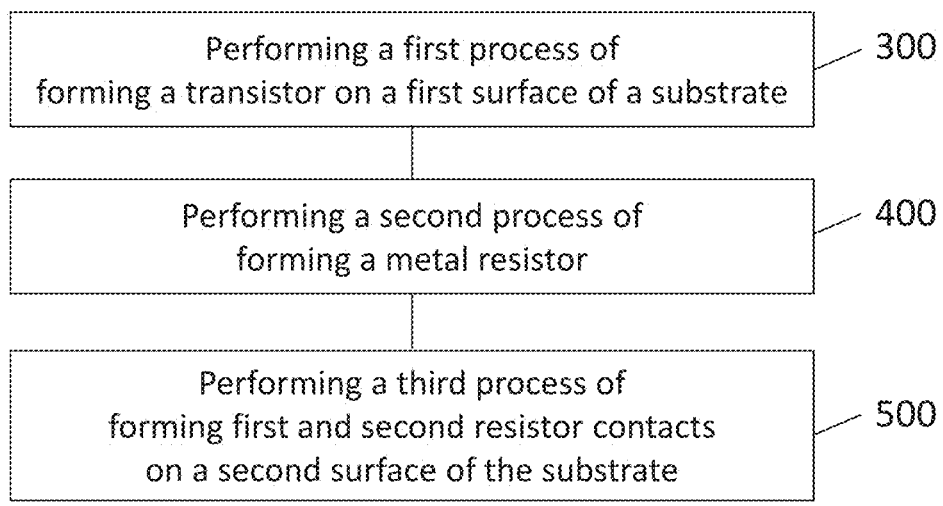
FIGS. 6 and 7 are flow charts of methods of forming an integrated circuit device according to some embodiments of the present invention.
Figure 7:
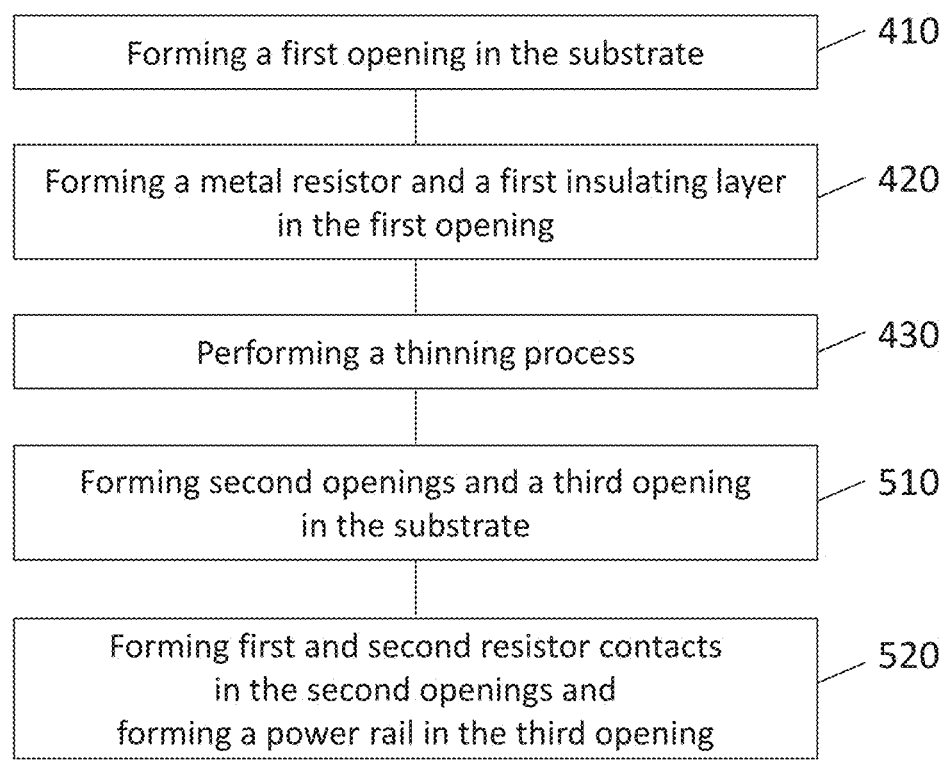

FIGS. 6 and 7 are flow charts of methods of forming an integrated circuit device according to some embodiments of the present invention. FIGS. 8-12 are cross-sectional views illustrating methods of forming an integrated circuit device according to some embodiments of the present invention. Referring to FIG. 6, the methods may include performing a first process of forming a transistor on a first surface of a substrate (Block 300), performing a second process of forming a metal resistor (Block 400), and performing a third process of forming first and second resistor contacts on a second surface of the substrate (Block 500). Block 300 may be performed before or after Blocks 400 and 500. Block 400 may be performed before or after Block 500.

Figure 8:
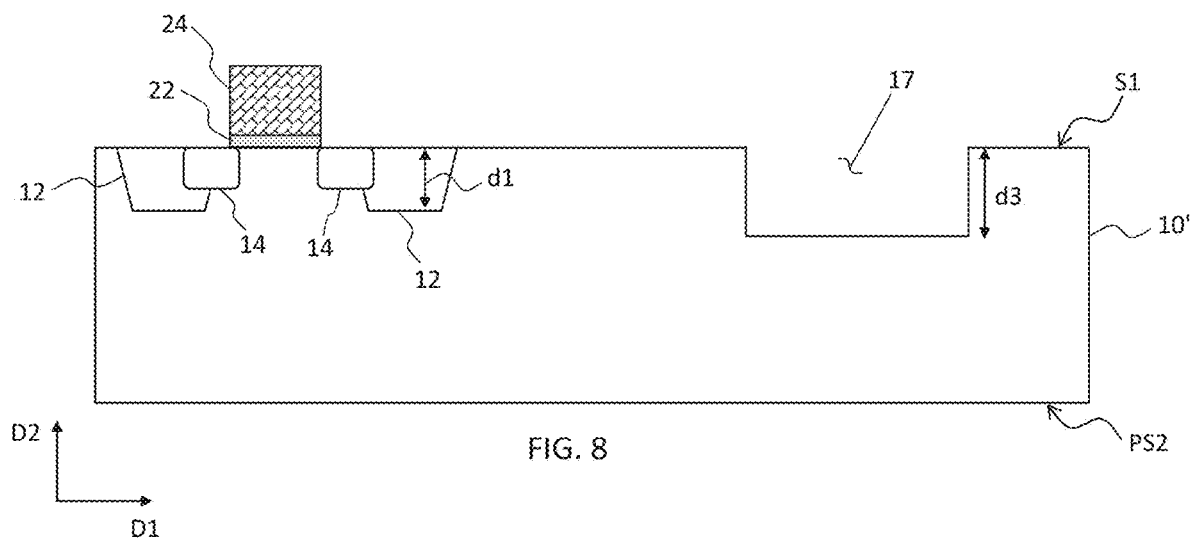
FIGS. 8, 9, 10, 11 and 12 are cross-sectional views illustrating methods of forming an integrated circuit device according to some embodiments of the present invention.

Referring to FIGS. 7 and 8, the methods may include performing the first process of forming a transistor on the first surface S1 of a preliminary substrate 10' (Block 300) and then etching the first surface S1 of a preliminary substrate 10', thereby forming a first opening 17 in the preliminary substrate 10' (Block 410). The preliminary substrate 10' may include a preliminary second surface PS2 that may be opposite and parallel to the first surface S1 of the preliminary substrate 10'. The first opening 17 may have a third depth d3 in the second direction D2, and the third depth d3 may be deeper than the first depth d1 of the isolation region 12.

Figure 9:
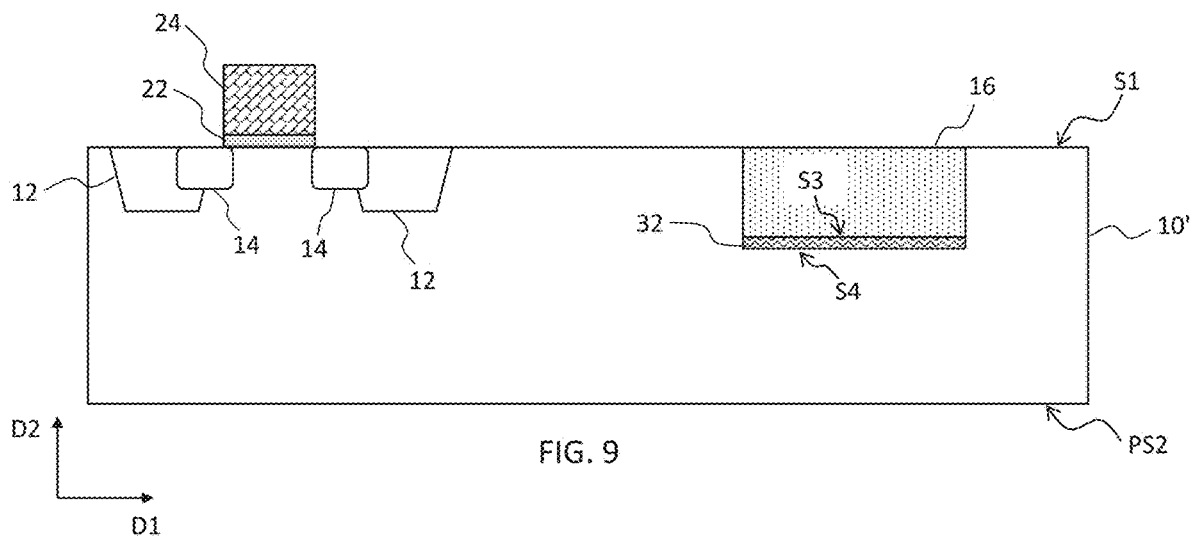

Referring to FIGS. 7 and 9, the second process of forming a metal resistor (Block 400) may include forming the metal resistor 32 and the first insulating layer 16 in the first opening 17 (Block 420). The metal resistor 32 may be formed by various deposition process (e.g., an atomic layer deposition (ALD) process). In some embodiments, the metal resistor 32 may be formed by an ALD process such that the metal resistor 32 may have a uniform thickness, and variations of a resistance may be reduced. In some embodiments, the first insulating layer 16 may fill the remainder of first opening 17, and a surface of the first insulating layer 16 may be coplanar with the first surface S1 of the preliminary substrate 10'.

Figure 10:
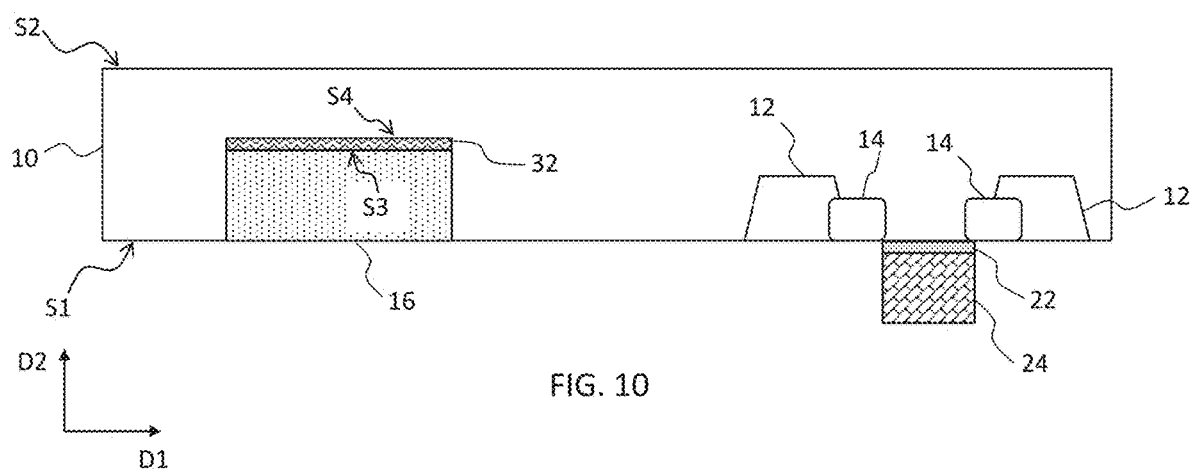

Referring to FIGS. 7 and 10, the methods may include performing a thinning process (Block 430) on the preliminary second surface PS2 of the preliminary substrate 10', thereby forming the substrate 10. The thinning process may include an etch process (e.g., a dry etch process and/or a wet etch process) and/or a grinding process.

Figure 11:
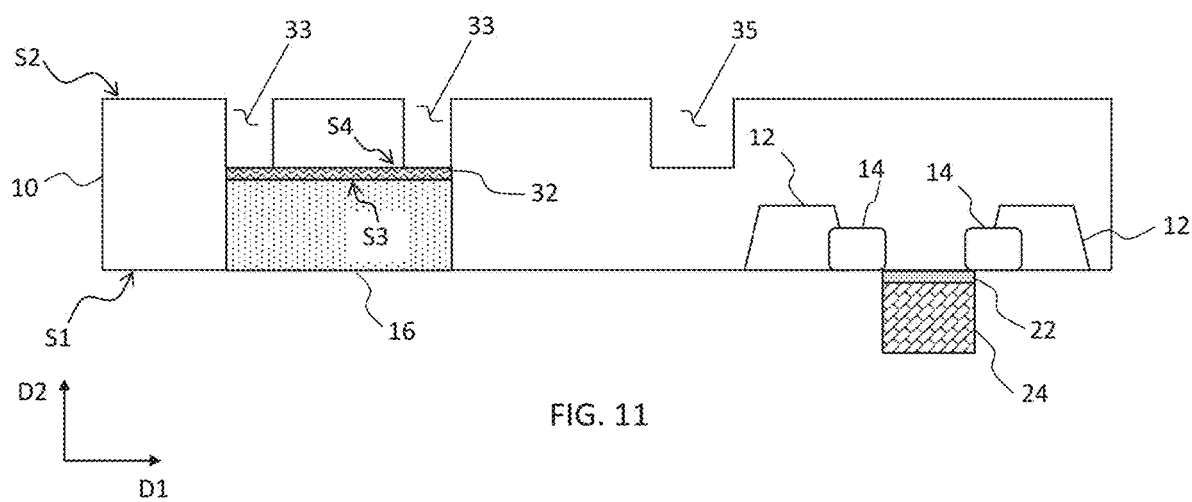

Referring to FIGS. 7 and 11, the third process of forming first and second resistor contacts (Block 500) may include etching the second surface S2 of the substrate 10, thereby forming second openings 33 and a third opening 35 in the substrate 10 (Block 510). The second openings 33 may expose the fourth surface S4 of the metal resistor 32. In some embodiments, the second openings 33 and the third opening 35 may be concurrently formed. As used herein, "formed concurrently" refers to being formed in a same fabrication step, at approximately (but not necessarily exactly) the same time.

Figure 12:
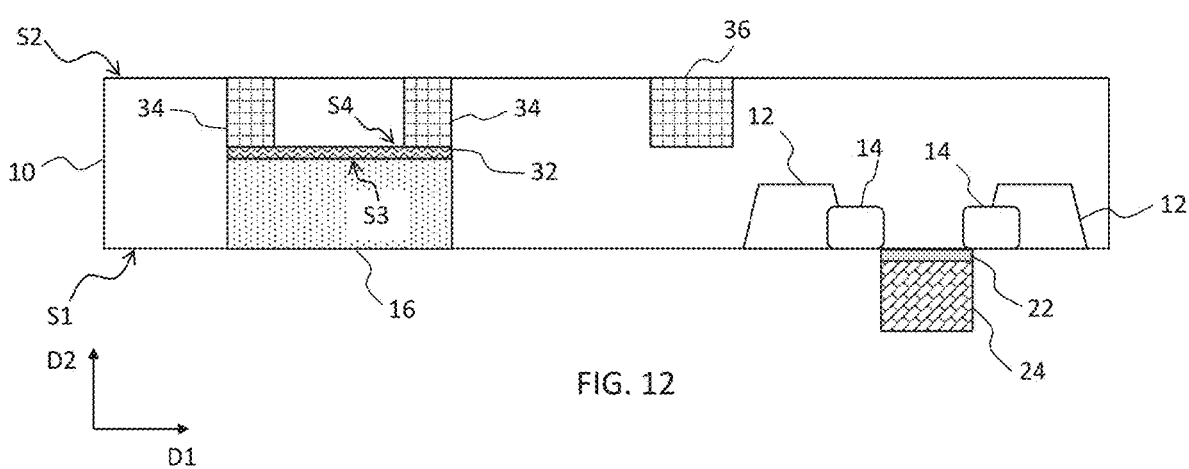

Referring to FIGS. 7 and 12, the third process of forming first and second resistor contacts (Block 500) may also include forming the first and second resistor contacts 34 in the second openings 33, respectively, and forming the power rail 36 in the third opening 35 (Block 520). In some embodiments, the first and second resistor contacts 34 and the power rail 36 may be formed concurrently. For example, a conductive layer may be formed on the second surface S2 of the substrate 10 and in the second openings 33 and the third opening 35 and then an etching process and/or a planarization process (e.g., a chemical mechanical polishing (CMP) process) may be performed until the second surface S2 of the substrate 10 is exposed.

In some embodiments, processes illustrated in FIGS. 10 through 12 may be performed and then processes illustrated in FIGS. 8 and 9 may be performed.

Figure 13:
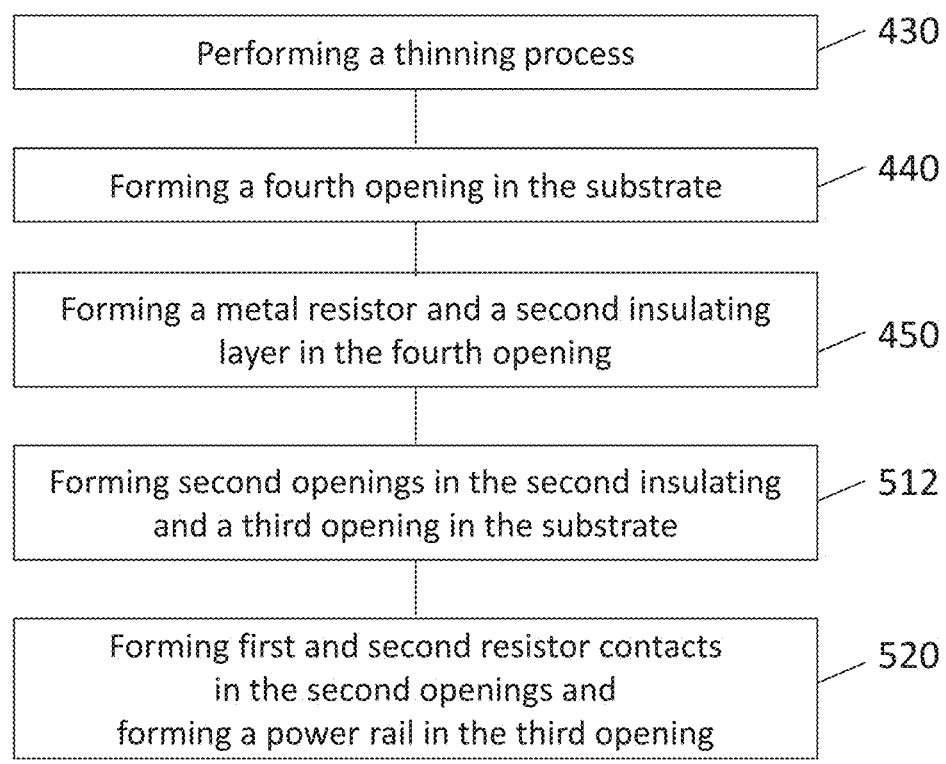
FIG. 13 is a flow chart of methods of forming an integrated circuit device according to some embodiments of the present invention.

FIG. 13 is a flow chart of methods of forming an integrated circuit device according to some embodiments of the present invention. FIGS. 14-17 are cross-sectional views illustrating methods of forming an integrated circuit device according to some embodiments of the present invention.

Figure 14:
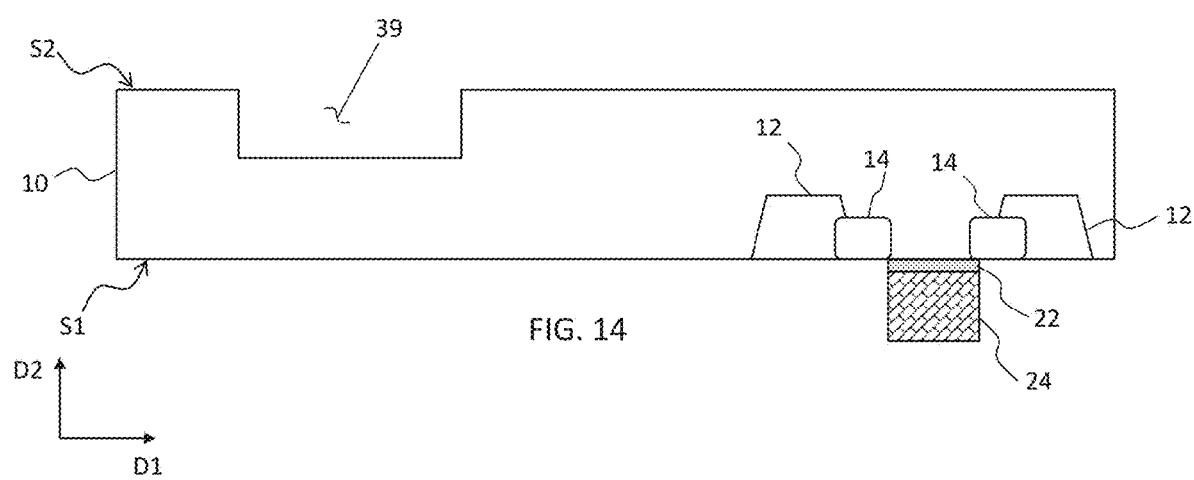
FIGS. 14, 15, 16 and 17 are cross-sectional views illustrating methods of forming an integrated circuit device according to some embodiments of the present invention.

Referring to FIGS. 13 and 14, the methods may include performing a thinning process (Block 430) to form the substrate 10 and then the second surface S2 of the substrate 10 may be etched to form a fourth opening 39 in the substrate 10 (Block 440).

Figure 15:
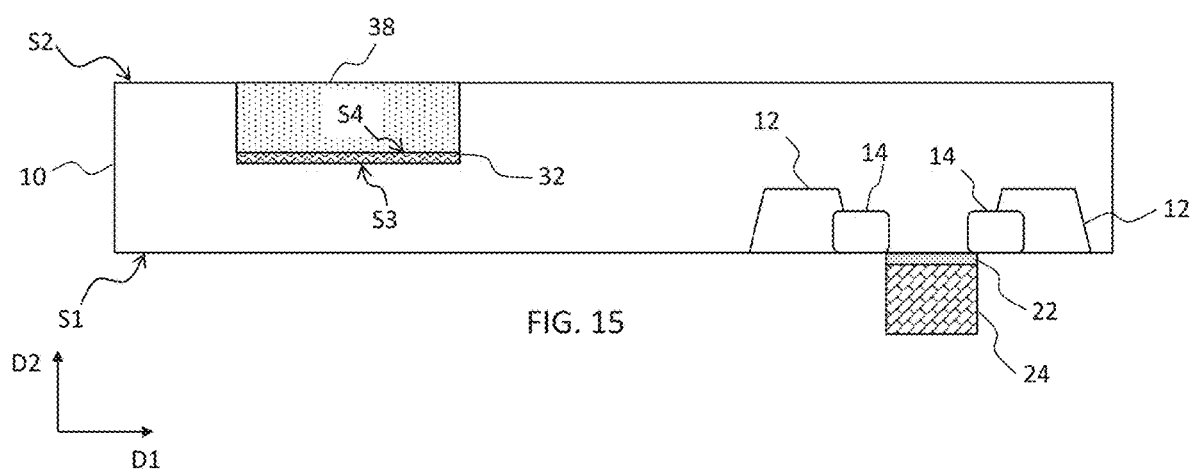

Referring to FIGS. 13 and 15, the methods may also include forming the metal resistor 32 and a second insulating layer 38 in the fourth opening 39 (Block 450). The metal resistor 32 may be formed by various deposition processes (e.g., an ALD process). In some embodiments, the second insulating layer 38 may fill the fourth opening 39 and a surface of the second insulating layer 38 may be coplanar with the second surface S2 of the substrate 10 as illustrated in FIG. 15.

Figure 16:
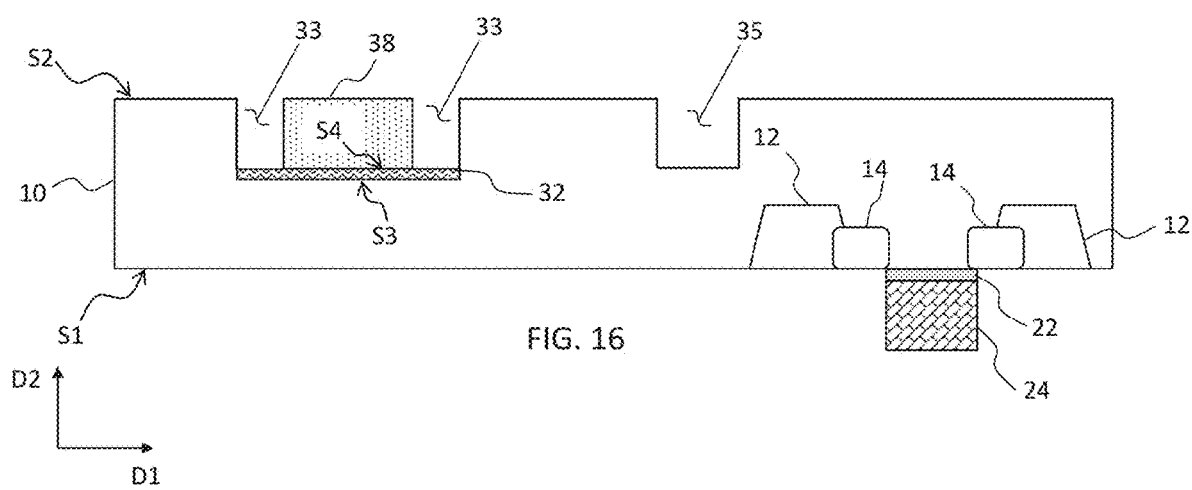
Figure 17:
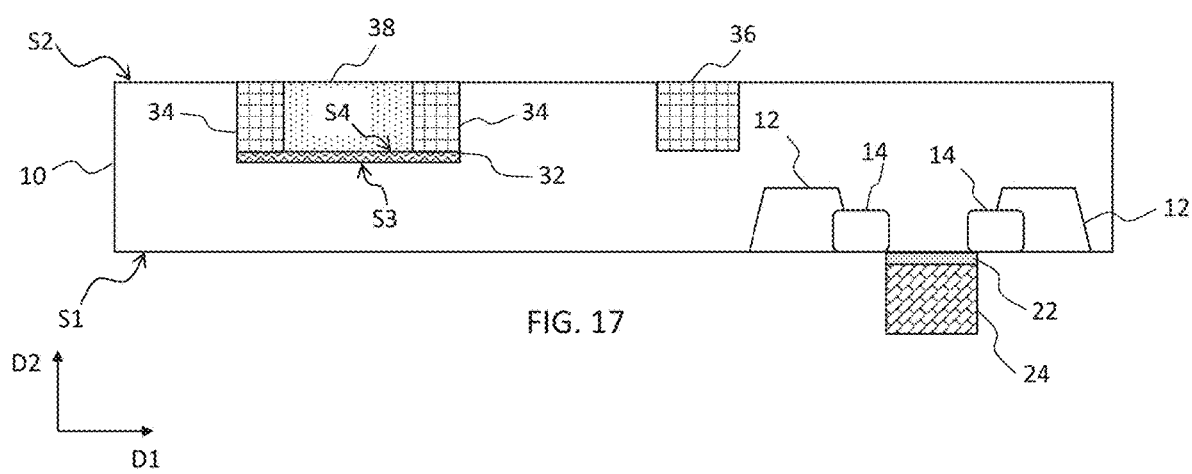

Referring to FIGS. 13 and 16, the methods may further include forming the second openings 33 in the second insulating layer 38 and the third opening 35 in the substrate 10 (Block 512). Referring to FIGS. 13 and 17, the first and second resistor contacts 34 may be formed in the second openings 33, respectively, and the power rail 36 may be formed in the third opening 35 (Block 520).

Although FIG. 14 illustrates that the transistor is formed on the first surface S1 of the substrate 10 before the thinning process is performed, the present invention is not limited thereto. In some embodiments, the transistor may be formed on the first surface S1 of the substrate 10 after the first and second resistor contacts 34 are formed.

Figure 18:
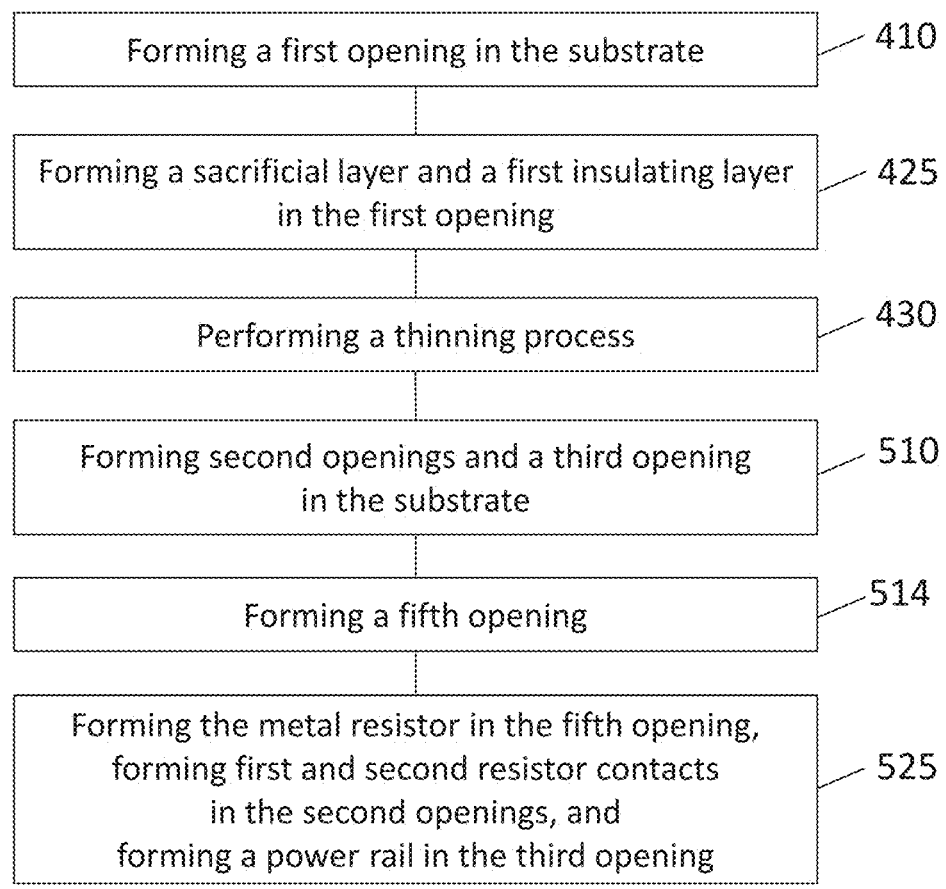
FIG. 18 is a flow chart of methods of forming an integrated circuit device according to some embodiments of the present invention.

FIG. 18 is a flow chart of methods of forming an integrated circuit device according to some embodiments of the present invention. FIGS. 19-22 are cross-sectional views illustrating methods of forming an integrated circuit device according to some embodiments of the present invention.

Figure 19:
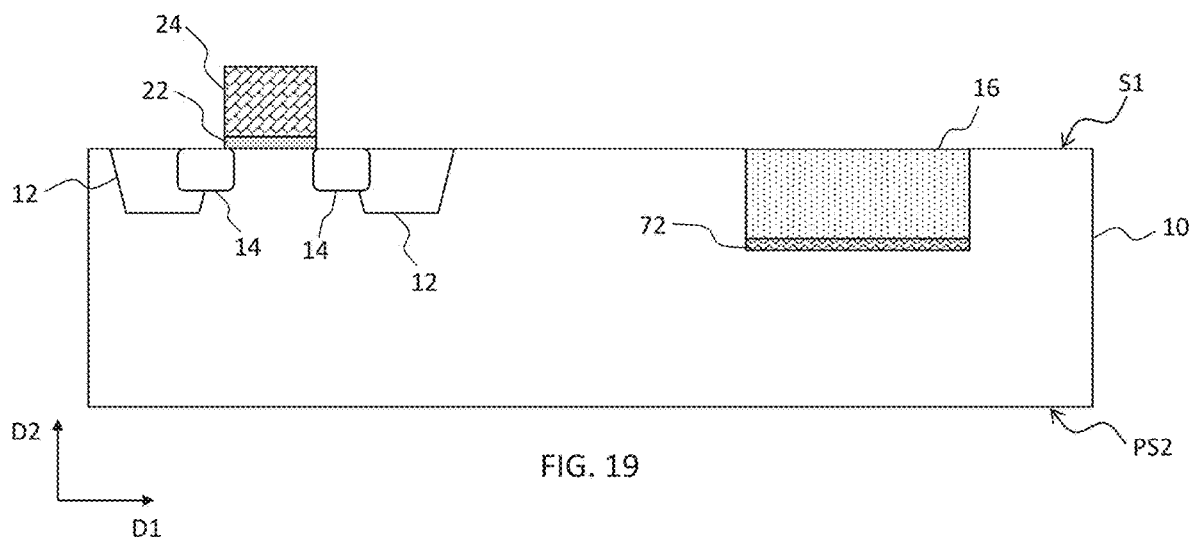
FIGS. 19, 20, 21 and 22 are cross-sectional views illustrating methods of forming an integrated circuit device according to some embodiments of the present invention.

Referring to FIGS. 18 and 19, the methods may include forming the first opening 17 in the substrate 10 (Block 410) as illustrated in FIG. 8 and then a sacrificial layer 72 and a first insulating layer 16 may be formed in the first opening 17 (Block 425). The methods may further include performing a thinning process (Block 430) as illustrated in FIG. 10 before or after the sacrificial layer 72 and the first insulating layer 16 are formed.

Figure 20:
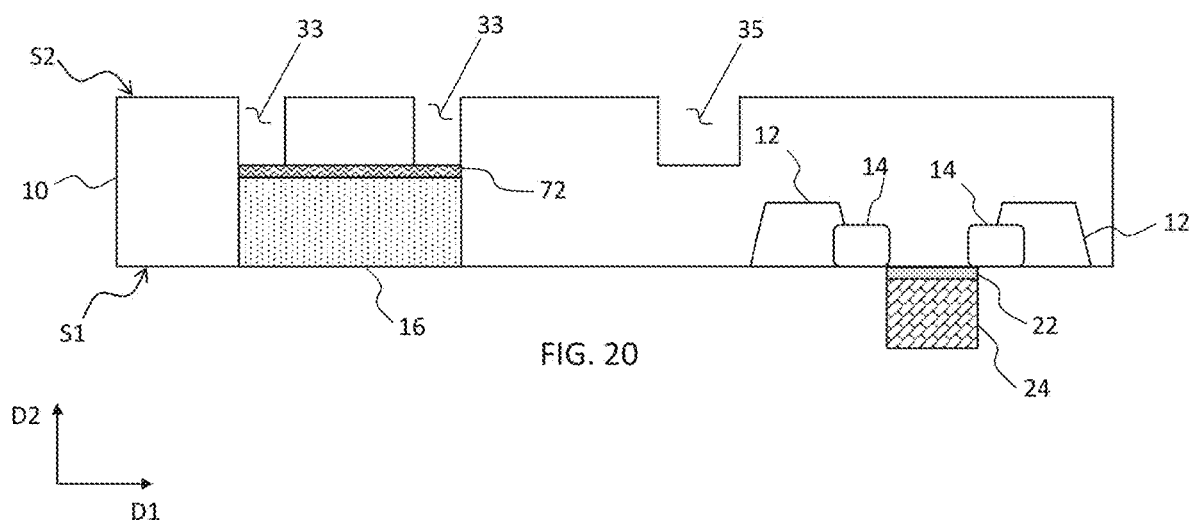

Referring to FIGS. 18 and 20, the methods may include forming the second openings 33 and the third opening 35 in the substrate 10 (Block 510). The second openings 33 may expose the sacrificial layer 72.

Figure 21:
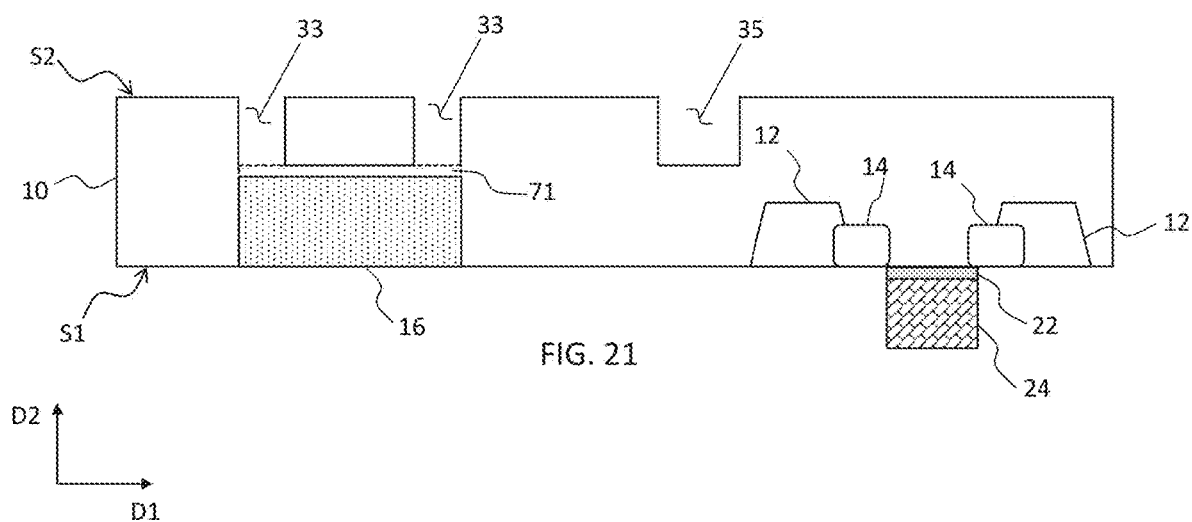
Figure 22:
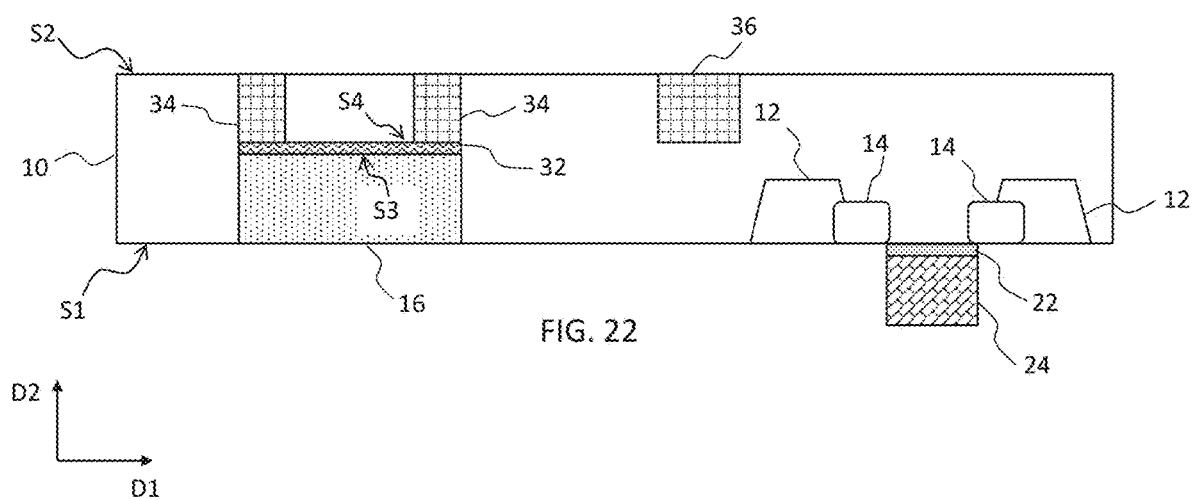

Referring to FIGS. 18 and 21, the sacrificial layer 72 may be removed, thereby forming a fifth opening 71 (Block 514). The sacrificial layer 72 may be removed by a dry etch process and/or a wet etch process. Referring to FIGS. 18 and 22, the metal resistor 32 may be formed in the fifth opening 71, the first and second resistor contacts 34 may be formed in the second openings, and the power rail 36 may be formed in the third opening 35 (Block 525). In some embodiments, the metal resistor 32 may be formed before the first and second resistor contacts 34 but the present invention is not limited thereto. In some embodiments, the metal resistor 32 and the first and second resistor contacts 34 may be formed by a single deposition process.

Figure 23:
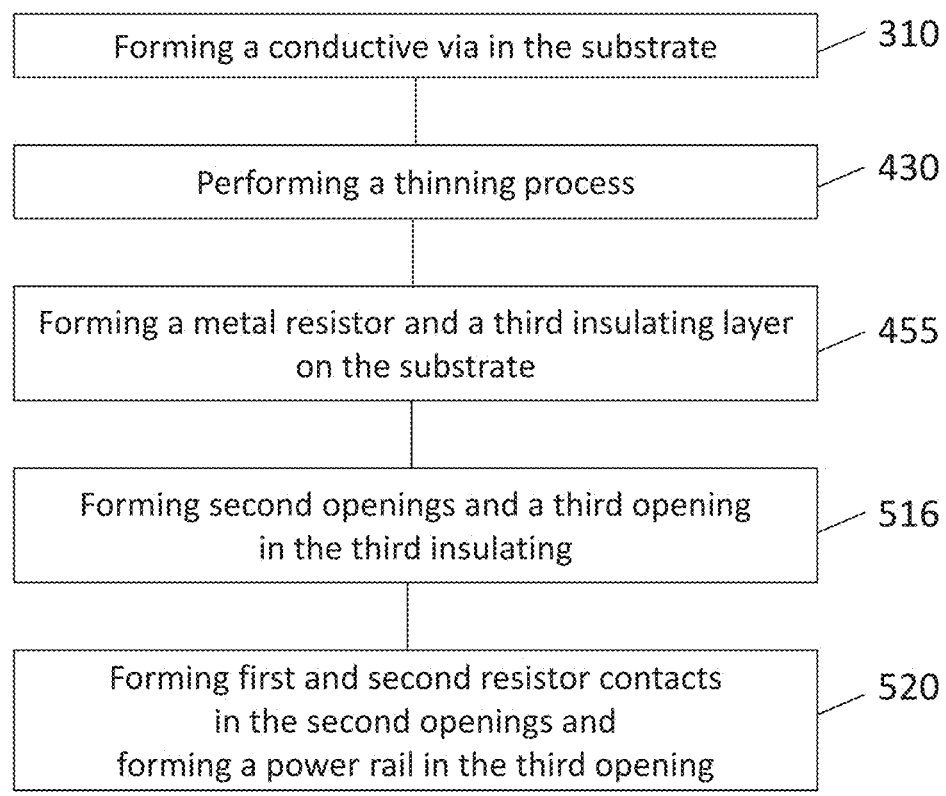
FIG. 23 is a flow chart of methods of forming an integrated circuit device according to some embodiments of the present invention.
Figure 24:
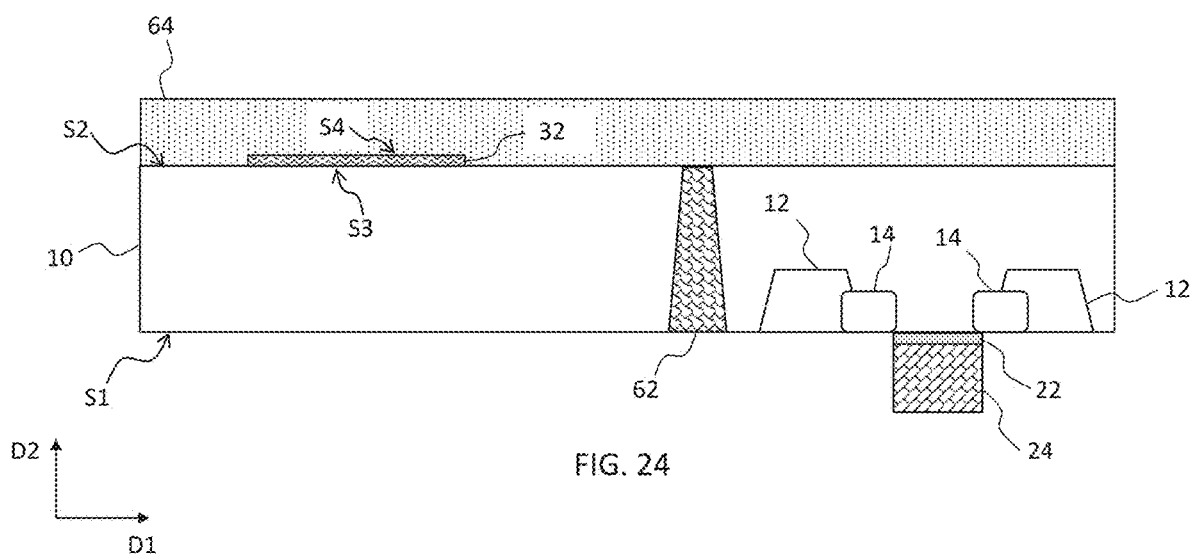
FIGS. 24, 25 and 26 are cross-sectional views illustrating methods of forming an integrated circuit device according to some embodiments of the present invention.
Figure 25:
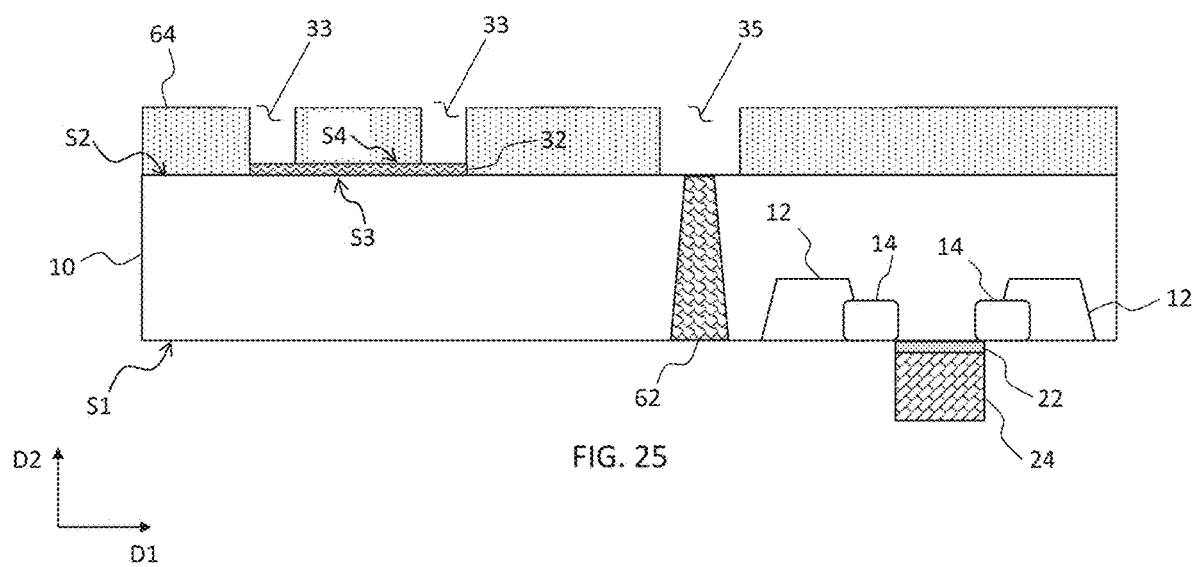
Figure 26:
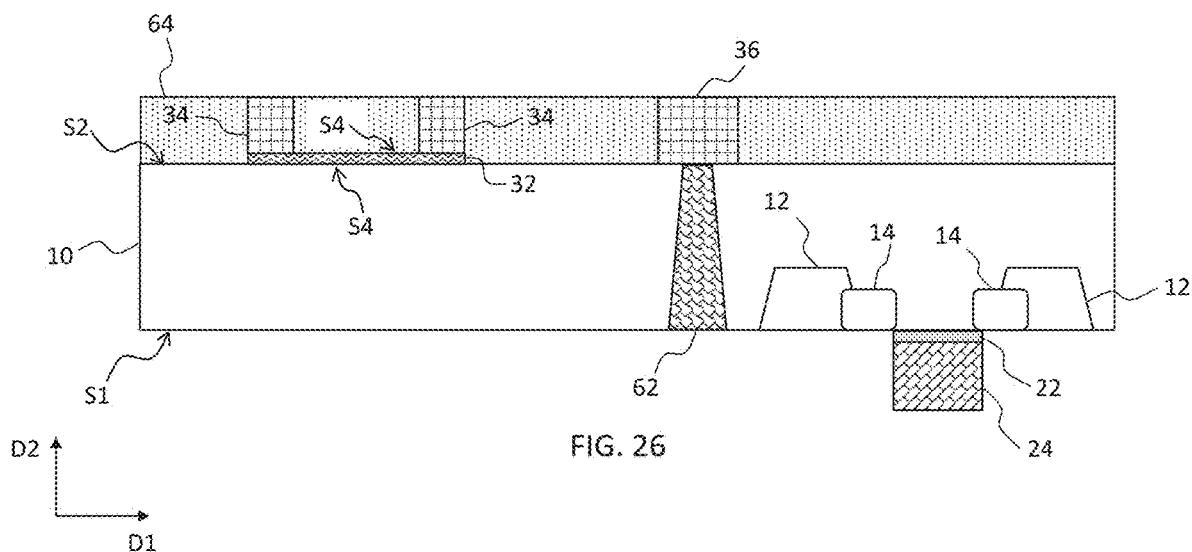

FIG. 23 is a flow chart of methods of forming an integrated circuit device according to some embodiments of the present invention. FIGS. 24-26 are cross-sectional views illustrating methods of forming an integrated circuit device according to some embodiments of the present invention.

Referring to FIGS. 23 and 24, the methods may include forming the conductive via 62 in the substrate 10 (Block 310). The conductive via 62 may extend through the substrate 10. The conductive via 62 may be formed before or after performing a thinning process (Block 430). The metal resistor 32 and a third insulating layer 64 may be formed on the second surface S2 of the substrate 10 after a thinning process is performed (Block 455). The metal resistor 32 may be formed by forming a preliminary metal resistor layer contacting the second surface S2 of the substrate 10 and then patterning the preliminary metal resistor layer.

Referring to FIGS. 23 and 25, the second openings 33 and the third opening 35 may be formed in the third insulating layer 64 (Block 516). The second openings 33 may expose the metal resistor 32 as illustrated in FIG. 25. Referring to FIGS. 23 and 26, first and second resistor contacts 34 may be formed in the second openings 33 and the power rail 36 may be formed in the third opening 35 (Block 520). In some embodiments, the first and second resistor contacts 34 and the power rail 36 may be formed concurrently.

Example embodiments are described herein with reference to the accompanying drawings. Many different forms and embodiments are possible without deviating from the scope of the present invention. Accordingly, the present invention should not be construed as limited to the example embodiments set forth herein. Rather, these example embodiments are provided so that this disclosure will be thorough and complete and will convey the scope of the present invention to those skilled in the art. In the drawings, the sizes and relative sizes of layers and regions may be exaggerated for clarity. Like reference numbers refer to like elements throughout.

Example embodiments of the present invention are described herein with reference to cross-sectional views that are schematic illustrations of idealized embodiments and intermediate structures of example embodiments. As such, variations from the shapes of the illustrations as a result, for example, of manufacturing techniques and/or tolerances, are to be expected. Thus, example embodiments of the present invention should not be construed as limited to the particular shapes illustrated herein but include deviations in shapes that result, for example, from manufacturing, unless the context clearly indicates otherwise.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of the stated features, steps, operations, elements and/or components, but do not preclude the presence or addition of one or more other features, steps, operations, elements, components and/or groups thereof. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the scope of the present invention.

The above-disclosed subject matter is to be considered illustrative, and not restrictive, and the appended claims are intended to cover all such modifications, enhancements, and other embodiments, which fall within the scope of the invention. Thus, to the maximum extent allowed by law, the scope is to be determined by the broadest permissible interpretation of the following claims and their equivalents and shall not be restricted or limited by the foregoing detailed description.

What is claimed is:

1. An integrated circuit device comprising:
   a substrate comprising a first surface and a second surface that is opposite the first surface and is parallel to the first surface;
   a transistor on the substrate, the transistor comprising a gate electrode, and the first surface of the substrate facing the gate electrode;
   first and second resistor contacts that are spaced apart from each other in a horizontal direction that is parallel to the second surface of the substrate, wherein each of the first and second resistor contacts comprises a contact surface that is exposed by the second surface of the substrate; and
   a metal resistor, wherein the metal resistor comprises a third surface and a fourth surface that is parallel to the first surface and the second surface of the substrate, and the fourth surface of the metal resistor is closer to the second surface than the first surface and contacts the first and second resistor contacts.

2. The integrated circuit device of claim 1, wherein the metal resistor is in the substrate.

3. The integrated circuit device of claim 1, wherein the first and second resistor contacts are in the substrate.

4. The integrated circuit device of claim 3, wherein the contact surface is coplanar with the second surface of the substrate.

5. The integrated circuit device of claim 1, further comprising an insulating layer that is in the substrate and contacts the third surface of the metal resistor.

6. The integrated circuit device of claim 1, further comprising an insulating layer that is in the substrate and contacts the fourth surface of the metal resistor.

7. The integrated circuit device of claim 6, wherein the insulating layer contacts side surfaces of the first and second resistor contacts.

8. The integrated circuit device of claim 1, wherein the third surface of the metal resistor is in contact with the second surface of the substrate.

9. The integrated circuit device of claim 8, further comprising an insulating layer on the metal resistor,
   wherein the first and second resistor contacts are in the insulating layer.

10. The integrated circuit device of claim 9, wherein the insulating layer comprises a fifth surface facing the substrate and a sixth surface that is opposite the fifth surface and is parallel to the fifth surface, and
    each of the first and second resistor contacts comprises a contact surface that is coplanar with the sixth surface of the insulating layer or protrudes outwardly beyond the sixth surface of the insulating layer.

11. The integrated circuit device of claim 9, further comprising:
    a power rail that is in the insulating layer and contacts the second surface of the substrate; and
    a conductive via extending through the substrate,
    wherein the transistor further comprises a source/drain region that is electrically connected to the power rail through the conductive via.

12. An integrated circuit device comprising:
    a substrate comprising a first surface and a second surface that is opposite the first surface and is parallel to the first surface;
    a metal resistor in the substrate;
    a transistor that is on the first surface of the substrate; and
    first and second resistor contacts that are in the substrate and are spaced apart from each other, the metal resistor contacting the first and second resistor contacts, and
    wherein each of the first and second resistor contacts comprises a contact surface that is coplanar with the second surface of the substrate or protrudes outwardly beyond the second surface of the substrate.

13. The integrated circuit device of claim 12, wherein:
    the transistor is spaced apart from the metal resistor in a horizontal direction that is parallel to the second surface of the substrate, and
    the first and second resistor contacts are spaced apart from each other in the horizontal direction.

14. The integrated circuit device of claim 12, wherein the metal resistor comprises a third surface and a fourth surface that is opposite the third surface and is parallel to the third surface, and the second surface of the substrate and the fourth surface of the metal resistor face the same direction, and
    the fourth surface of the metal resistor is in contact with the first and second resistor contacts.

15. The integrated circuit device of claim 14, further comprising an insulating layer that is in the substrate and is in contact with the fourth surface of the metal resistor.

16. The integrated circuit device of claim 15, wherein the insulating layer contacts side surfaces of the first and second resistor contacts.

17. An integrated circuit device comprising:
    a substrate comprising a first surface and a second surface that is opposite the first surface;
    a transistor on the first surface of the substrate;
    first and second resistor contacts that are spaced apart from each other in a first direction that is parallel to the second surface of the substrate, wherein each of the first and second resistor contacts comprises a contact surface that is exposed by the second surface of the substrate; and
    a metal resistor that contacts the first and second resistor contacts and is between the first and second surfaces of the substrate.

18. The integrated circuit device of claim 17, wherein the contact surface is coplanar with the second surface of the substrate.

19. The integrated circuit device of claim 17, wherein the contact surface protrudes outwardly beyond the second surface of the substrate.

20. The integrated circuit device of claim 17, wherein the transistor is spaced apart from the metal resistor in the first direction.

* * * * *